(12) United States Patent
Greene

(10) Patent No.: US 9,746,144 B1
(45) Date of Patent: *Aug. 29, 2017

(54) LIGHT STRIP AND METHOD FOR MAKING A LIGHT STRIP

(71) Applicant: Jason Greene, Massapequa, NY (US)

(72) Inventor: Jason Greene, Massapequa, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/499,474

(22) Filed: Apr. 27, 2017

Related U.S. Application Data

(63) Continuation of application No. 15/007,316, filed on Jan. 27, 2016, now Pat. No. 9,671,075, which is a continuation of application No. 14/726,764, filed on Jun. 1, 2015, now abandoned.

(60) Provisional application No. 62/006,382, filed on Jun. 2, 2014.

(51) Int. Cl.

| F21S 4/00 | (2016.01) |
|---|---|
| F21V 21/00 | (2006.01) |
| F21S 4/22 | (2016.01) |
| F21V 23/02 | (2006.01) |
| F21V 23/06 | (2006.01) |
| F21V 19/00 | (2006.01) |
| H05B 33/08 | (2006.01) |
| F21Y 115/10 | (2016.01) |
| F21Y 103/10 | (2016.01) |

(52) U.S. Cl.
CPC ............ *F21S 4/22* (2016.01); *F21V 19/0025* (2013.01); *F21V 23/02* (2013.01); *F21V 23/06* (2013.01); *H05B 33/0821* (2013.01); *F21Y 2103/10* (2016.08); *F21Y 2115/10* (2016.08)

(58) Field of Classification Search
CPC .. F21Y 2115/10; F21Y 2103/10; F21V 23/06; H01L 2924/0002; H01L 2924/00
USPC ..................................................... 362/249.04
See application file for complete search history.

(56) References Cited

U.S. PATENT DOCUMENTS

| 3,786,173 A | 1/1974 | Vogt |
|---|---|---|
| 4,032,210 A | 6/1977 | Vogt |
| 4,990,098 A | 2/1991 | Neidecker et al. |
| 5,032,960 A | 7/1991 | Katoh |
| 5,296,648 A | 3/1994 | Johnson |
| 5,337,225 A | 8/1994 | Brookman |
| 5,559,681 A | 9/1996 | Duarte |
| 5,681,179 A | 10/1997 | Lane |
| 5,833,358 A | 11/1998 | Patik |
| 6,113,248 A | 9/2000 | Mistopoulos et al. |
| 6,244,893 B1 | 6/2001 | Dudley et al. |
| 6,673,292 B1 | 1/2004 | Gustafson et al. |
| 6,773,286 B1 | 8/2004 | Wu |
| 7,140,751 B2 | 11/2006 | Lin |
| 7,249,980 B2 | 7/2007 | Ferderer |
| 7,753,577 B2 | 7/2010 | Teeters |
| 8,052,303 B2 | 11/2011 | Lo et al. |
| 8,262,250 B2 | 9/2012 | Li et al. |
| 8,398,262 B2 | 3/2013 | Sloan et al. |

(Continued)

*Primary Examiner* — Elmito Breval
*Assistant Examiner* — Jessica M Apenteng
(74) *Attorney, Agent, or Firm* — Collard & Roe, P.C.

(57) ABSTRACT

A light strip has a flexible enclosure extruded around a pair of conductors. The enclosure contains a lighting assembly with one or more flexible substrates populated with a plurality of light circuits. The substrates are spaced from the pair of conductors. The lighting assembly has a plurality of connecting devices for electrically coupling the lighting assembly to the pair of conductors.

22 Claims, 7 Drawing Sheets

(56) References Cited

U.S. PATENT DOCUMENTS

| | | |
|---|---|---|
| 8,635,769 B2 | 1/2014 | Liu |
| 8,641,229 B2 | 2/2014 | Li |
| 8,714,772 B1 | 5/2014 | Levante et al. |
| 2002/0106931 A1* | 8/2002 | Hsien-Te ................ F21V 23/06 439/490 |
| 2012/0113633 A1 | 5/2012 | Bowen |

* cited by examiner

LIGHT STRIP AND METHOD FOR MAKING A LIGHT STRIP

CROSS-REFERENCES TO RELATED APPLICATIONS

This application is a continuation of U.S. patent application Ser. No. 15/007,316 filed on Jan. 27, 2016 which is a continuation of U.S. patent application Ser. No. 14/726,764, filed on Jun. 1, 2015, which claims the benefit of U.S. Provisional Patent Application Ser. No. 62/006,382, filed on Jun. 2, 2014. The contents of each of the afore-mentioned applications are hereby incorporated by reference herein.

BACKGROUND OF THE INVENTION

1. Field of the Invention

The present invention relates to lighting strips and methods for making the same, and in particular to extrusions and extrusion methods for such light strips.

2. Description of Related Art

Flexible printed circuit boards have been manufactured in strips that are populated with light emitting diodes. The strips can be mounted in a transparent tubular sleeve that is easily mounted in a variety of locations. These lighting strips can be placed inside cabinets, along corridors to light a walkway, or any place where a compact lighting source is required.

Light emitting diodes have relatively small forward voltage drops and therefor require a voltage conversion unit such as a transformer, which adds to the complexity of the installation. Also known light strips have included ASICs to regulate the applied voltage, but these ASICs tend to be large, generate much heat, and have a tendency to pull off the underlying, flexible printed circuit board.

Known lighting strips have flexible circuit boards that carry both the lighting elements and buses that carry power throughout the strip. When the strip is relatively long, the buses must carry significant current that tends to heat a flexible circuit board and degrades the performance of the adjacent LEDs, possibly causing them to fail. Many applications require an especially long lighting strip. In such cases a number of shorter strips are spliced together and mounted in a common sleeve, end to end. In this case the buses on each strip are serially connected and must carry current for all the lighting elements in the several strips. Such a common bus carries even more current, and generates even more heat that seriously affects the lighting elements.

Also, it can be difficult to mount in a single sleeve, long lighting strips or a number of serially connected lighting strips.

See also U.S. Pat. Nos. 3,786,173; 4,032,210; 4,990,098; 5,032,960; 5,296,648; 5,337,225; 5,559,681; 5,681,179; 5,833,358; 6,113,248; 6,244,893; 6,673,292; 6,773,286; 7,249,980; 7,753,577; 8,052,303; 8,262,250; 8,398,262; 8,635,769; 8,641,229; and 8,714,772.

SUMMARY OF THE INVENTION

In accordance with the illustrative embodiments demonstrating features and advantages of the present invention, there is provided light strip including a pair of conductors, and a flexible enclosure extruded around the pair of conductors. The light strip also has a lighting assembly including one or more flexible substrates positioned within the enclosure and populated with a plurality of light circuits. The one or more substrates are spaced from the pair of conductors. The lighting assembly has a plurality of connecting devices for electrically coupling the lighting assembly to the pair of conductors.

In accordance with another aspect of the invention, a method is provided for making a light strip having a pair of conductors and one or more flexible substrates populated with a plurality of light circuits. The method includes the step of extruding a plastic material around the pair of conductors to form a flexible enclosure sized to encompass the one or more flexible substrates and maintain a spacing between the pair of conductors and the one or more flexible substrates.

By employing apparatus and methods of the foregoing type an improved lighting strip is achieved using techniques that ease manufacture and assembly. In a disclosed embodiment a transparent sleeve is extruded around a pair of conductors that supply power to the lighting strip. The flexible printed circuit board carrying the LEDs is spaced from these supply conductors and are not overheated by them. In this embodiment a flexible circuit board has a number of separate strings of LEDs whose current is limited either by a resistor or a depletion mode field effect transistor. Each string of LEDs on the flexible circuit board has its own dedicated pair of solder pads that are each connected to one end of a jumper whose other end connects to one of the supply conductors.

These disclosed jumpers may be soldered in place in advance, so that the flexible circuit board and supply conductors are simultaneously coextruded into a flexible sleeve, with extrudate partially enveloping the jumpers. The printed circuit board is not enveloped by the extrudate to avoid trapping it in an insulating layer that prevents heat dissipation.

In some cases the flexible sleeve can be extruded around just the supply conductors and part of the jumpers, which jumpers to or connected to the supply conductors but not to the missing flexible circuit board. In that case the sleeve will have a longitudinal slit (a split). The split in can be opened with an appropriate tool that allows an end of the flexible circuit board to be inserted into this sleeve. Thereafter the tool is slid back to open progressive positions in the longitudinal split, allowing the rest of the flexible strip to be placed inside the sleeve. Thereafter, an assembler can solder the free ends of the jumpers to the solder pads on the flexible circuit board.

In either case, a number of separate flexible printed circuit boards can be installed end to end, but instead of being directly interconnected, they are simply connected to the supply conductors embedded in the flexible sleeve.

The disclosed LEDs have a relatively high forward voltage drop. This allows one to apply a higher voltage to a string of LEDs. In a disclosed embodiment the LEDs are arranged to handle the rectified line voltage from an ordinary utility line, without the need for a stepdown transformer or other device for reducing the voltage applied to the lighting circuit. The rectifying circuit can be placed in a housing that is in line with a cord having with a plug that connects to an ordinary utility outlet. Alternatively, the rectifier circuit can be placed in a junction box and hardwired to a power line. A separate cable can run from the junction box to the lighting strip.

In a disclosed embodiment, this rectified line voltage is applied to the lighting strip with a connector having a shell containing a pair of pointed pins. When the connector is pushed onto a lighting strip the pointed pins are inserted into the coextruded supply conductors which are made of stranded wires that are easily invaded by the pointed pins. The shell of the connector matches the asymmetrical periphery of the flexible sleeve containing the flexible printed circuit board. The asymmetry is arranged such that the connector can only be placed on one and of the flexible sleeve to avoid a reversed polarity.

BRIEF DESCRIPTION OF THE DRAWINGS

The above brief description as well as other objects, features and advantages of the present invention will be more fully appreciated by reference to the following detailed description of illustrative embodiments in accordance with the present invention when taken in conjunction with the accompanying drawings, wherein.

DETAILED DESCRIPTION

Figure 1:
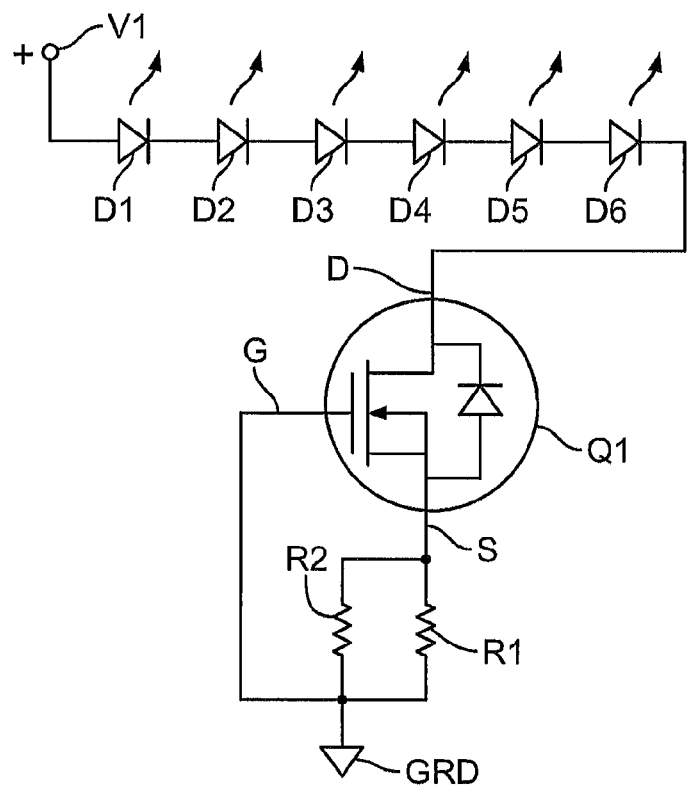
FIG. 1 is a schematic diagram of a light circuit in accordance with principles of the present invention.

Referring to FIG. 1, the illustrated light circuit has six serially connected LEDs, D1, D2, D3, D4, D5, and D6, in that order (hereinafter LEDs D1-D6). LEDs D1-D6 are connected cathode to anode and are all connected to be forwardly biased by a positive potential at terminal V1. The anode of diode D1 is directly connected to terminal V1, while the cathode of diode D6 is directly connected to drain D of depletion mode field effect transistor Q1 (FET transistor Q1). In one embodiment transistor Q1 was a model CPC3708 transistor supplied by IXYS, Integrated Circuits Division, although other types of transistors from other suppliers may be used in other embodiments. Gate G of transistor Q1 is grounded, and its source S is connected through a parallel pair of resistors R1 and R2 to ground. Accordingly, the power input to this light circuit is applied across terminal V1 and ground.

Configured in this manner, transistor Q1 will conduct when relatively small voltage is applied across the transistor, but will shut off when the voltage increases. Initially, the voltage at terminal V1 must at least exceed the sum of the forward voltage drops across diodes D1-D6. Thereafter, the shutoff voltage is determined by the characteristics of transistor Q1, the forward voltage drop of diodes D1-D6, and the resistance of resistors R1 and R2 (having a net resistance of, for example, 66.5 Ohms).

In this embodiment a full wave rectified voltage is applied between terminal V1 and ground, so that a unipolar, fluctuating sine wave is applied in each half cycle. Accordingly, transistor Q1 conducts once the combined forward voltage drop is reached and diodes D1-D6 begin to conduct, but stops conducting when the input voltage becomes too large. The conduction angle of transistor Q1 can be tailored to accommodate the number and the rating of diodes D1-D6. Thus, transistor Q is a power restricting device.

In this embodiment, the six diodes D1-D6 each have a forward voltage drop of 24 V, that is, a total voltage drop of 144 V. Other embodiments are anticipated. For example some embodiments may use four serially connected diodes, each having a forward voltage drop of 36 V, that is, a total voltage drop of 144 V. It will be appreciated that the total voltage drop can be modified for some embodiments, depending on whether one desires a larger or smaller conduction angle, the ratings of the diodes, the available line voltage, etc. Good results are achieved when the forward voltage drop of each of the LEDs exceeds 8 V.

Figure 2:
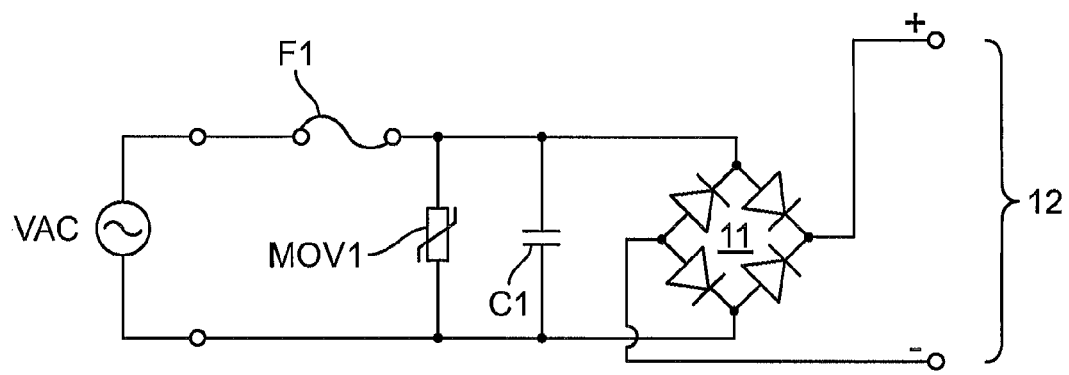
FIG. 2 is a schematic diagram of a rectifier circuit that may be used in connection with the circuit of FIG. 1.

Referring to FIG. 2, a rectifier circuit is illustrated for providing the power input for the light circuit of FIG. 1. In FIG. 2, a source of alternating current VAC, which may be the ordinary power supplied by a local utility, connects through fuse F1 across metal oxide varistor MOV1, which provides surge protection. Capacitor C1 is connected in parallel with varistor MOV1 to suppress RF transmission and interference. A conventional full wave bridge 11 has its input connected across capacitor C1 to produce an output 12. It will be understood that half-wave bridges may be used or other type of rectification arrangements may be used instead. Good results are achieved when the time-varying voltage at output 12 has a peak voltage greater than 100 V.

Figure 3:
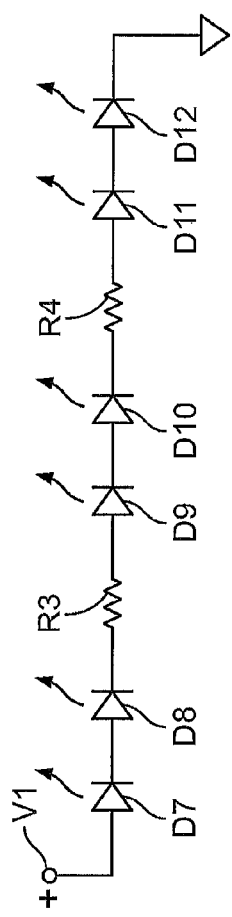
FIG. 3 is a schematic diagram of a light circuit that is an alternate to that of FIG. 1.

Referring to FIG. 3, the previously illustrated transistor (transistor Q1 of FIG. 1) was replaced with current limiting resistors R3 and R4 (which constitute another power restricting device). Specifically, diodes D7, D8, D9, D10, D11, and D12 are serially connected as before (cathode to anode) in that order. However, resistor R3 is serially connected between diodes D8 and D9, and resistor R4 is serially connected between diodes D10 and D11. This string is connected between previously mentioned terminal V1 and ground.

Figure 4:
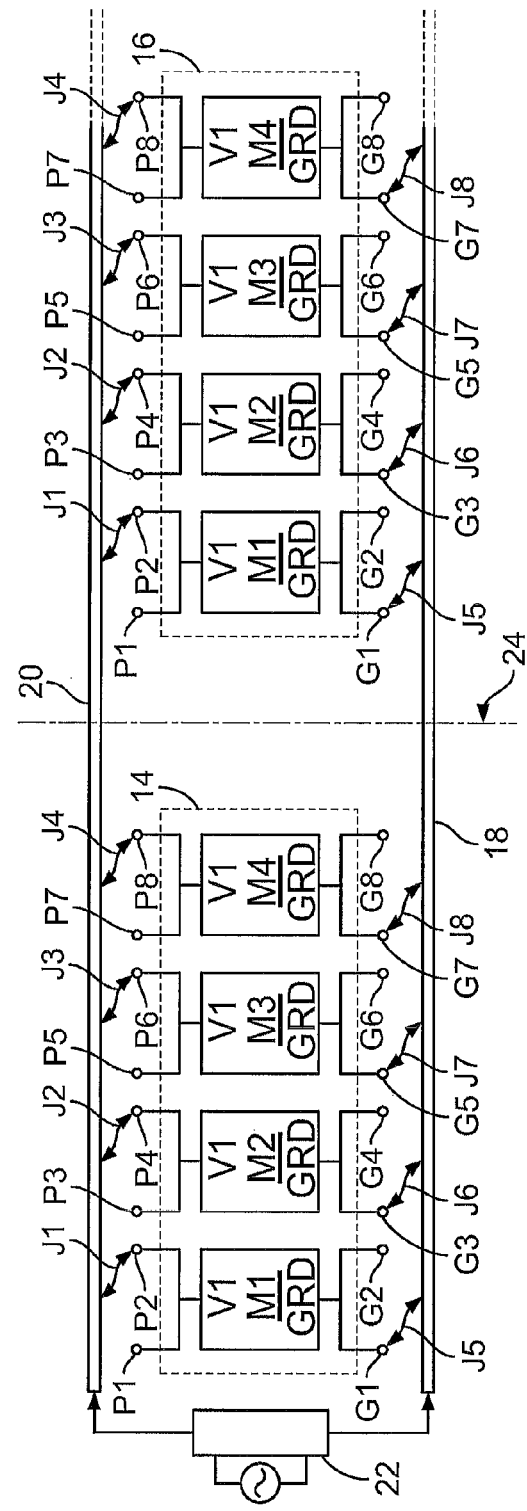
FIG. 4 is a schematic diagram of the light circuit of FIG. 1 or 3 replicated and segregated into separate groups that are each mounted on a flexible substrate to formal light strip.

Referring to FIG. 4, a light strip is schematically illustrated as two flexible substrates 14 and 16, mounted end two end. While two substrates are illustrated, it will be understood that some embodiments may employ only one substrate, or more than two substrates. In this embodiment substrates 14 and 16 are identical and each have four identical lighting circuits M1, M2, M3, and M4. Each of these circuits M1-M4 is that shown in the FIG. 1. While the given number of lighting circuits M1-M4 is four, in other embodiments a different number may be employed. Terminal V1 is that previously illustrated, while ground is identified as terminal GRD.

In this diagram substrates 14 and 16 are illustrated with their longer, lateral edges running right and left. Each of the light circuits M1-M4 have a pair of solder pads connected to terminal V1 and a pair of solder pads connected to terminal GRD. Specifically, circuit M1 has solder pads P1 and P2 connected to its terminal V1, circuit M2 has solder pads P3 and P4 connected to its terminal V1, circuit M3 has solder pads P5 and P6 connected to its terminal V1, and circuit M4 has solder pads P7 and P8 connected to its terminal V1. Also, circuit M1 has solder pads G1 and G2 connected to its terminal GRD, circuit M2 has solder pads G3 and G4 connected to its terminal GRD, circuit M3 has solder pads G5 and G6 connected to its terminal GRD, and circuit M4 has solder pads G7 and G8 connected to its terminal GRD.

A pair of conductors 18 and 20 are shown positioned adjacent to substrates 14 and 16, on opposite sides of the substrates 14 and 16. Power is supplied to conductors 18 and 20 by rectifying circuit 22, which is as illustrated in FIG. 2. In particular, conductor 20 receives the high potential while conductor 18 is ground.

Each of the lighting circuits M1-M4 has a separated pair of leads (jumpers) acting as a connecting device to conductors 18 and 20. Specifically, lead J1 is soldered between pad P2 and conductor 20, while lead J5 is soldered between pad G1 and conductor 18. Also, lead J2 is soldered between pad P4 and conductor 20, while lead J6 is soldered between pad G3 and conductor 18. Lead J3 is soldered between pad P6 and conductor 20, while lead J7 is soldered between pad G5 and conductor 18. Lead J4 is soldered between pad P8 and conductor 20, while lead J8 is soldered between pad G7 and conductor 18. It will be understood that different pads may be used as a matter of convenience. For example, lead J1 could be connected between pad P1 and conductor 20.

It will be noted that substrates 14 and 16 are not directly interconnected and thus can be severed along line 24. In fact, none of the four light circuits M1-M4 on substrates 14 and 16 are directly interconnected and thus each substrate can be severed into quarters (one quarter, two quarters, or three quarters). In the case of severing, another rectifier circuit, similar to circuit 22, may be connected to the left ends of the conductors 18 and 20 remaining in the severed segment, and that segment will be able to operate without any negative effect caused by the severing.

Figure 5:
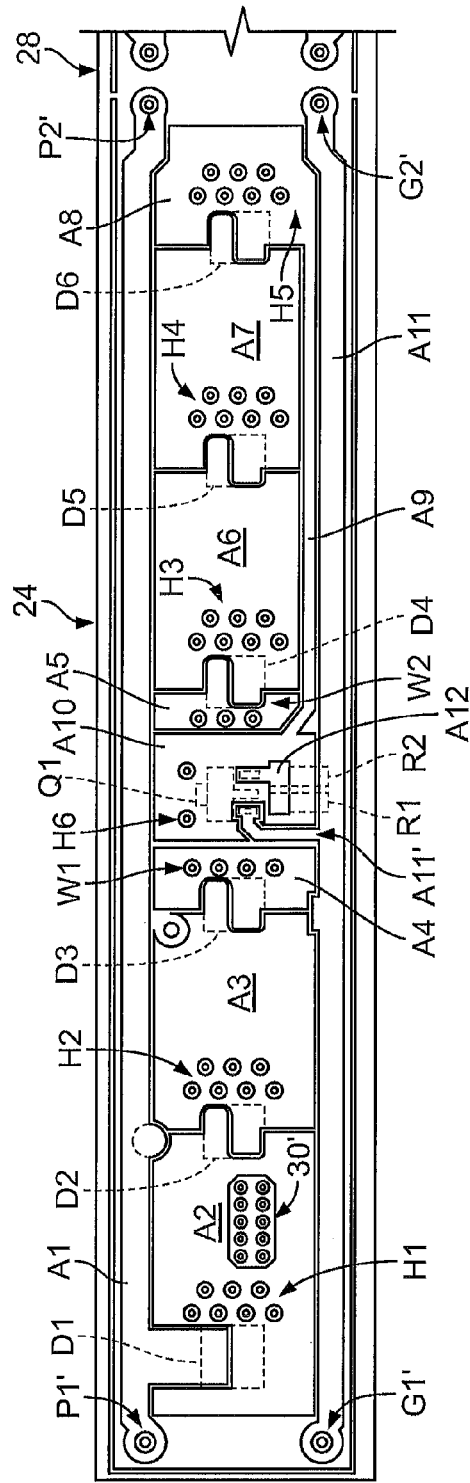
FIG. 5 is a fragmentary, plan view of an upper copper lamination that is part of the substrate associated with the circuit of FIG. 4.
Figure 6:
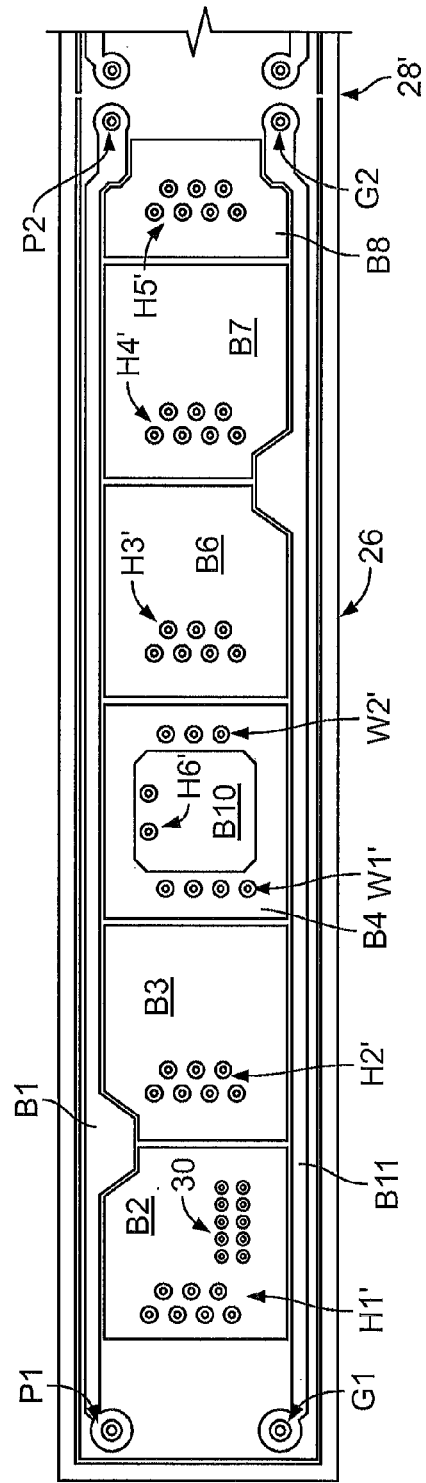
FIG. 6 is a fragmentary, plan view of a lower copper lamination that is part of the substrate associated with the circuit of FIG. 4.

Referring to FIGS. 5 and 6, a complementary pair of copper laminations 24 and 26 are designed to be registered as shown and attached by appropriate adhesives to opposite sides of an intervening layer of polyamide, before being covered with a conventional solder mask (not shown). In the usual fashion, the copper laminations have been etched while on the polyamide with the portions removed by etching illustrated herein in the color black. Laminations 24 and 26 are designed to implement the circuit of FIG. 1, and the illustrated portion will repeated on the remaining (unillustrated) portions to implement the substrate of FIG. 4 (substrate 14 or 16).

Lower lamination 26 is shown having previously mentioned solder pads P1, P2, G1, and G2 in the upper left corner, upper right corner, lower left corner, and lower right corner, respectively. Pads P1 and P2 are interconnected by run B1, while pads G1 and G2 are interconnected by run B11. In this embodiment plated-through holes connect between upper and lower laminations 24 and 26, in order to separately connect lower pads P1, P2, G1, and G2 to upper pads P1', P2', G1', and G2', respectively. Pads P1 and P2' are interconnected by run A1, while pads G1' and G2' are interconnected by run A11.

Lamination 24 is shown segregated into isolated segments A1, A2, A3, A4, A5, A6, and A7. Segments A8 and A10 are interconnected by run A9.

Components previously mentioned in FIG. 1 are shown in phantom as follows: (a) diode D1 connecting between segments A1 and A2, (b) diode D2 connecting between segments A2 and A3, (c) diode D3 connecting between segments A3 and A4, (d) diode D4 connecting between segments A5 and A6, (e) diode D5 connecting between segments A6 and A7, and (f) diode D6 connecting between segments A7 and A8.

Plated-through holes W1/W1' connect together segments A4 and B4, while plated-through holes W2/W2' connect together segments B4 and A5. The net effect of these plated through holes is to connect together segments A4 and A5. It will be appreciated that the foregoing provides a serial connection of diodes D1-D6 from pad P2 to run A9.

Run A9 leads to segment A10 and previously mentioned transistor Q1 (shown in phantom) is mounted with its drain connected to segment A10. Run A11 has a spur A11' that ends in a pad that connects to the gate of transistor Q1. Isolated pad A12 connects on one end to the source of transistor Q1, and on the opposite end to one terminal of each of the resistors R1 and R2 (also shown in phantom), whose other terminals connect to run A11. It will be appreciated that the foregoing arrangement produces the circuit previously described in FIG. 1.

It will be noticed that in lamination 26 segments B2, B3, B6, and B7 are isolated and are not designed to carry current. Instead, these segments are used as heat sinks to dissipate heat generated by components mounted atop upper lamination 24. In particular, segments B2, B3, B6, and B7 thermally connect through plated-through holes H1/H1', H2/H2', H3/H3', H4/H4', respectively, to respective segments A2, A3, A6, and A7. In addition, segment B10 thermally connects through plated-through holes H6/H6' to segment A10. Plated-through holes H1/H1', H2/H2', H3/H3', H4/H4', and H6/H6' are referred to herein as a dedicated portion of the plated-through holes, designed to conduct heat without conducting current.

It will be appreciated that the foregoing pattern repeats and that each repetition can operate independently. Each adjacent repetition can be separated as desired by severing them apart at cutline 28/28'. The solder mask (not shown) covering laminations 24 and 26 can be marked to indicate the cutlines. As previously described, power is applied to the illustrated light circuit by applying a supply voltage between runs A1 and A11 and for this purpose one of the pads P1, P2 is paired with one of the pads G1, G2 to connect to conductors 18 and 20 and act as a supply source.

The ten plated-through holes 30/30' (five pairs) connecting between segments A2 and B2 are designed to receive a non-functional component such as dummy resistor (not shown). This nonfunctional component can be soldered into one of five positions, which signify a quality of the lighting strip. For example, the solder mask (not shown) at holes 30/30' can be marked to indicate a color temperature of the LEDs D1-D6 (e.g., 5000 K, 4000 K, 3000 K, 2700 K, or 2400 K).

Figure 7:
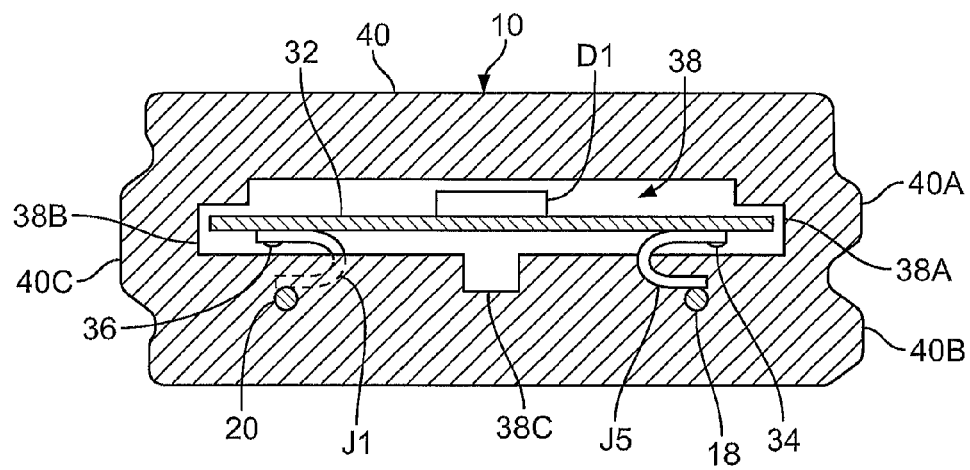
FIG. 7 is a cross-sectional view of a flexible enclosure containing the substrate of FIGS. 4-6 to form a light strip.

Referring to FIG. 7, flexible enclosure 40 is an extrusion of thermoplastic material, such as PVC, a high density polyethylene, polychlorotrifluoroethylene, an ionomer resin, or other plastic material. Enclosure 40 has a periphery with an asymmetrical cross-section specifically, enclosure 40 has a pair of ridges 40A and 40B on one side, and on the other side a single ridge 40C, which is at a different elevation than either of the ridges 40A and 40B. These asymmetrical ridges serve a purpose that will be described presently. In this embodiment enclosure 40 has an overall width of 1 inch (2.5 cm) and overall thickness of ⅜ inch (1 cm), although other dimensions may be employed depending on the available space, the materials used, the size and rating of the LEDs and other components, etc.

Enclosure 40 is tubular and has a longitudinal tunnel 38 containing a lighting assembly, which includes printed circuit board 32 (board 32 also referred to as a substrate) populated with the electrical components previously described in connection with FIGS. 4-6. Diode D1 is visible in this view. This assembly is identified as light strip 10.

Light strip 10 also has the leads J1-J8 illustrated in FIG. 4. Leads J1 and J5 visible in this view and are shown soldered on the outside end to conductors 18 and 20, respectively, and on the inside end to respective positions 34 and 36 at substrate 32. Positions 34 and 36 correspond to previously mentioned solder pads (pads G1 and P2 of FIG. 4). It will be noticed that enclosure 40 is extruded completely around conductors 18 and 20, and is partially extruded around an outside portion of leads J1 and J5. In this embodiment conductors 18 and 20 are each made of stranded wire.

Longitudinal tunnel 38 is generally rectangular but has longitudinal slots 38A and 38B for holding the lateral edges of substrate 32, and longitudinal gutter 38C that provides space for heat dissipation.

Figure 8:
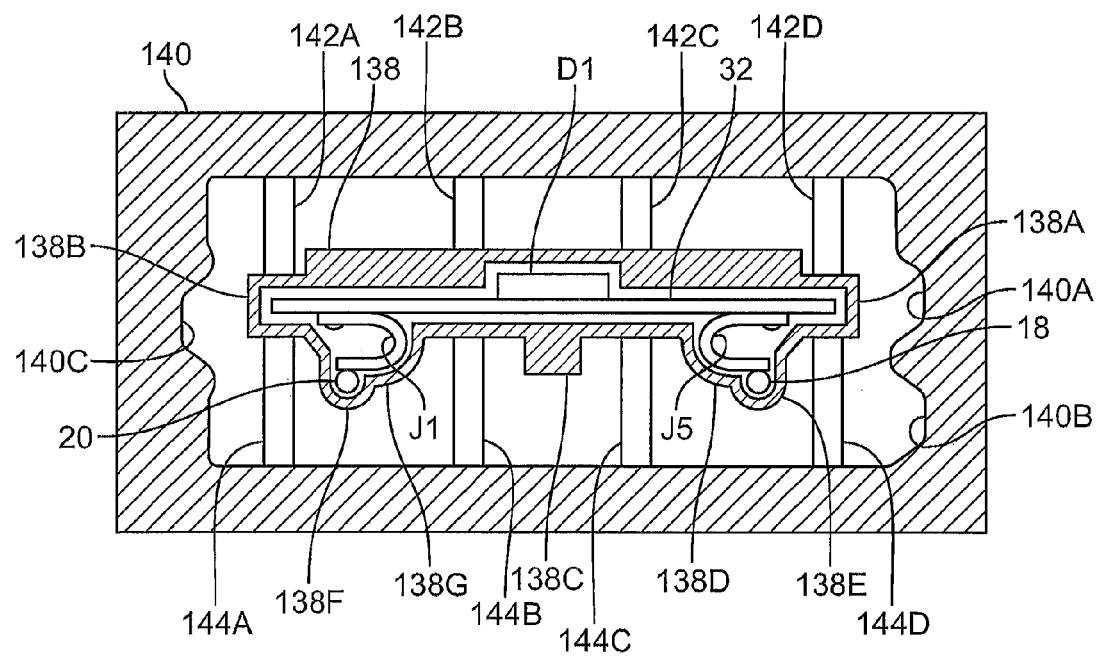
FIG. 8 is a cross-sectional view of a the used to extrude the arrangement of FIG. 7.

Referring to FIGS. 7 and 8, die 140 of FIG. 8 is designed to extrude the previously mentioned enclosure 40 of FIG. 7. Specifically, the inside of die 140 has flat upper and lower walls, a right sidewall having channels 140A and 140B for forming previously described ridges 40A and 40B of FIG. 7. The left inside wall of die 140 has a channel 140C for forming ridge 40C of FIG. 7.

A die 138 is nested inside die 140 and is supported on top by posts 142A, 142B, 142C, and 142D, and from below by lower posts 144A, 144B, 144C, and 144D. The direction of extrusion is out of the drawing of FIG. 8, and the posts 142A-142D and 144A-144D are set back enough that extrudate will flow around them without leaving gaps. Previously mentioned substrate 30 is shown traveling inside die 138 in the same direction as the extrudate.

The previously mentioned tunnel 38 of FIG. 7 is formed by internal die 138 which has approximately the same peripheral outline as the tunnel, including protrusion 138C for forming gutter 38C, and protrusions 138A 138B for forming slots 38A and 38B. Die 138 deviates from the outline of tunnel 38 in the case of protrusions 138D and 138E on the right, and protrusions 138F and 138G on the left. Protrusions 138D and 138G are formed by quarter-cylindrical walls that provide clearance for leads J5 and J1, respectively, as well as for the other leads that follow behind them. Protrusion 138E and 138F include semicylindrical walls that provide clearance for previously mentioned conductors 18 and 20, respectively.

In FIG. 7 conductors 18 and 20 as well as the adjacent portions of leads J1 and J5 are embedded inside the plastic material of enclosure 40. To allow such an embedding, walls 138D-138G of FIG. 8 may have slits or apertures that allow extrudate to flow around conductors 18 and 20 and leads J1 and J5.

Also, after the first extrusion stage, the combined enclosure 40 and substrate 32 may be sent through a second die that compresses the enclosure, completes the flow of extrudate around conductors 18 and 20, and embeds the edges of substrate 32 inside notches 38A and 38B.

The overall length of the resulting light strip will depend on the number of substrates 32 that are installed. The individual substrates will be preassembled end to end and pre-wired to conductors 18 and 20. If, for example, nine substrates 32 that are each 16 inches (40 cm) long are assembled end to end, the overall length will be 12 feet (or twice that length with eighteen substrates 32). Since each substrate 32 has four banks (four of the circuits of FIG. 1), each substrate can be quartered as previously described in connection with FIG. 4. Two and a quarter substrates can be a abutted end to end to produce an overall length of 3 feet (or double those amounts to produce an overall length of 6 feet).

Figure 9:
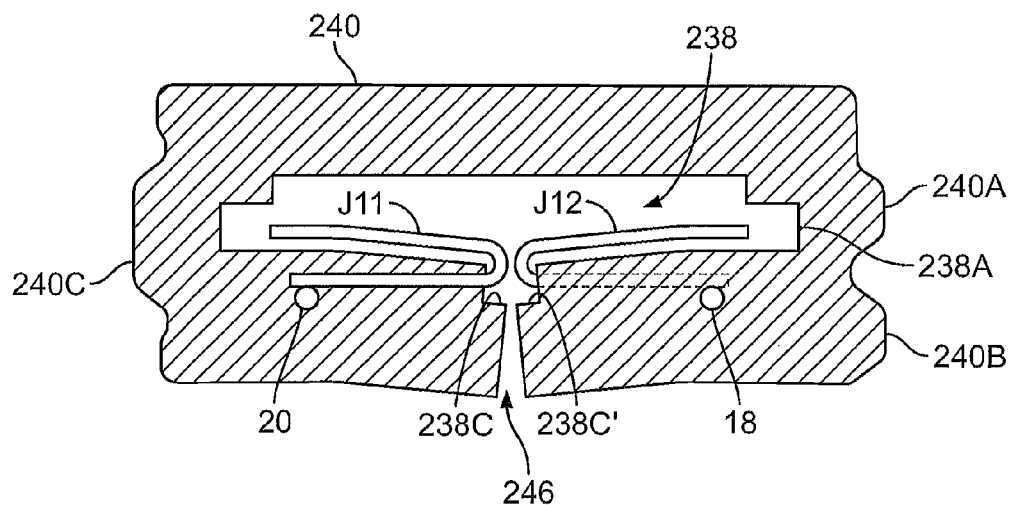
FIG. 9 is a cross-sectional view of extrusion that is an alternate to that of FIG. 7.

Referring to FIG. 9, an alternate flexible enclosure 240 is extruded in the absence of the substrate (substrate 32 of FIG. 8). Enclosure 240 has the same cross-section as enclosure 40 of FIG. 7 except for a longitudinal split 246. Accordingly, components corresponding to that of FIG. 7 have the same reference numeral, except they are increased by 200. Longitudinal split 246 splits the previously mentioned gutter (gutter 38C of FIG. 7) into two gutter halves, 238C and 238C'.

As before, enclosure 240 is extruded around conductors 18 and 20. While enclosure 240 is again partially excluded around leads J11 and J12 (and the corresponding leads that follow), the leads are routed differently and emerge into gutter 238C/238C'. Since leads J11 and J12 follow a more tortuous path, they are longer. As will be explained presently, longitudinal split 246 is used as an opening for installing the previously mentioned substrate.

Figure 10:
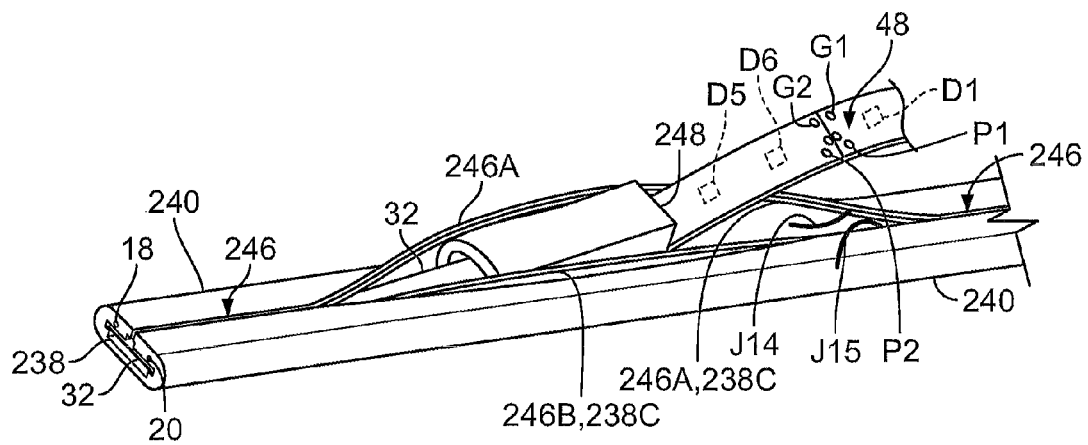
FIG. 10 is a perspective view of the extrusion of FIG. 9 being partially opened with tool that is being used to insert the substrate of FIGS. 4-6.

Referring to FIG. 10, previously mentioned enclosure 240 is shown lying with its longitudinal split 246 facing up. At one location split 246 is spread apart enough to insert the distal (forward) end of tubular spreading tool 248 between the split's opposing walls 246A and 246B. Previously mentioned substrate 32 is shown inserted through tool 248 to lie inside tunnel 238 as shown at the distal end of enclosure 240. The distal end of enclosure 240 can be squeezed lightly to hold the distal end of substrate 32 in place, as tool 248 is drawn backwardly. As tool 248 is drawn backwardly (moving proximally), the spread-apart sector moves, and this moving sector allows more and more of substrate 32 to pass through the tool and fall into position inside enclosure 240.

In FIG. 10 previously mentioned diodes D5 and D6 are in one light circuit, and diode D1 is in the succeeding light circuit. (These diodes are shown in phantom in FIG. 10 because they are on the reverse side of substrate 32.) As previously described, individual lighting circuits can operate independently and can be severed apart. For this reason the solder mask of substrate 32 has been marked at position 48 with a straight line overlaid with a scissors symbol to specifically indicate where to cut the substrate. It will be appreciated that the solder mask on the reverse side of substrate 32 can be also marked to indicate the cutline. These cutlines can be used when the assembler desires to make a light strip shorter than substrate 32.

In some cases the assembler will want a light strip that is longer than substrate 32, whose length in one embodiment was 16 inches (40 cm). In such a case, a new substrate will be inserted immediately following the first substrate. In practice a number of successive substrates can be inserted in this fashion to produce a light strip of various lengths. The last substrate that is inserted can be cut at one of the designated cutlines to trim the light strip to the desired length.

As noted before in connection with FIG. 9, the embedded leads J11 and J12 will emerge from the opposing faces of gutter halves 238C and 238C'. This feature is depicted in FIG. 10 with lead J14 emerging from gutter half 238C' in wall 246A of split 246, and lead J15 emerging from gutter half 238C in wall 246B of split 246. It will be noticed that lead J14 is associated with the light circuit to the left of cutline marking 48, while lead J15 is associated with the next light circuit to the right of cutline 48. Such leads will emerge once on wall 246A and once on wall 246B for every light circuit (i.e., once on each wall for every six diodes D1-D6, or once on each wall for every interval between cutlines).

The assembler will push substrate 32 past leads such as leads J14 and J15, and will use a pick (not shown) to pull them outwardly so they are accessible through split 246. Thereafter, when all these substrates 32 destined for enclosure 240 are in place, the assembler may will use tool 248 to open split 246 at every location where a connection must be made to leads, such as leads J14 and J15. So for example, leads J14 and J15 will be soldered to pads G2 and P1, respectively, which are shown in this Figure on the opposite sides of cutline 48.

The assembly is completed by sealing split 246. This may be done by sending enclosure 240 through a die that compresses the enclosure and applies heat to the split 246 to weld it closed.

Figure 11:
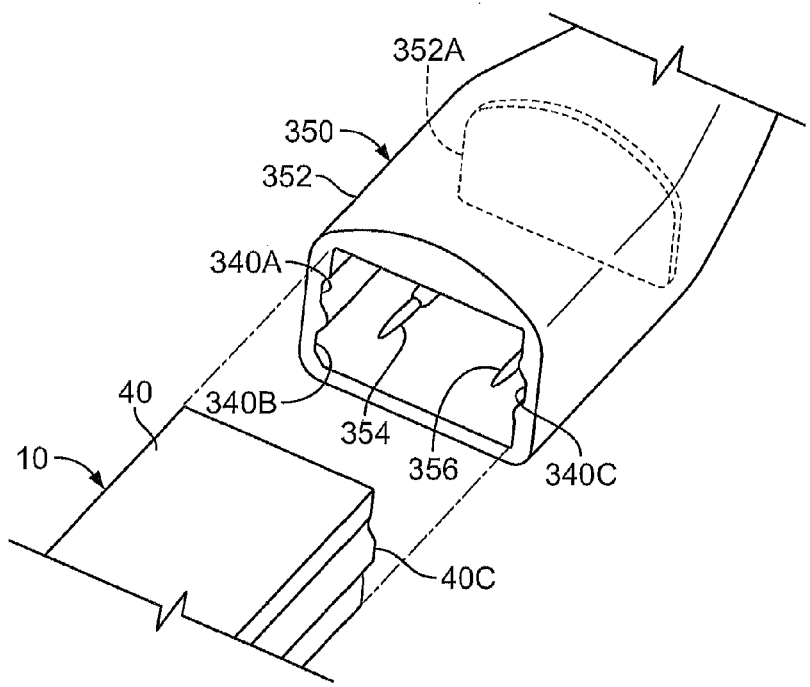
FIG. 11 is a fragmentary, perspective view of a connector being used to connect to the light strip of FIG. 7.

Referring to FIG. 11, connector 350 has a cup-shaped shell 352 with a rear wall 352A (shown in phantom) supporting a pair of pointed pins 354 and 356. The inside of shell 352 is designed to fit around flexible enclosure 40 of the light strip 10. In particular, groove 340C on the inside of shell 352 is designed to fit around ridge 40C. Grooves 340A and 340B are shaped to fit around corresponding ridges on enclosure 40 (ridges 40A and 40B of FIG. 7). Accordingly, connector 350 is keyed to enclosure 40 by means of grooves 340A, 340B, and 340C. Because the keying is asymmetrical, connector 350 will only fit over one end of enclosure 40 and will be unable to fit on the opposite end, even if the connector is rotated 180 degree.

When shell 352 is pressed over enclosure 40 of light strip 10 pointed pins 354 and 356 are inserted into conductors 18 and 20 (FIG. 7), respectively. Since conductors 18 and 20 are each made of stranded wire, pointed pins 354 and 356 are able to insinuate themselves into the strands and make electrical contact therewith.

Figure 12:
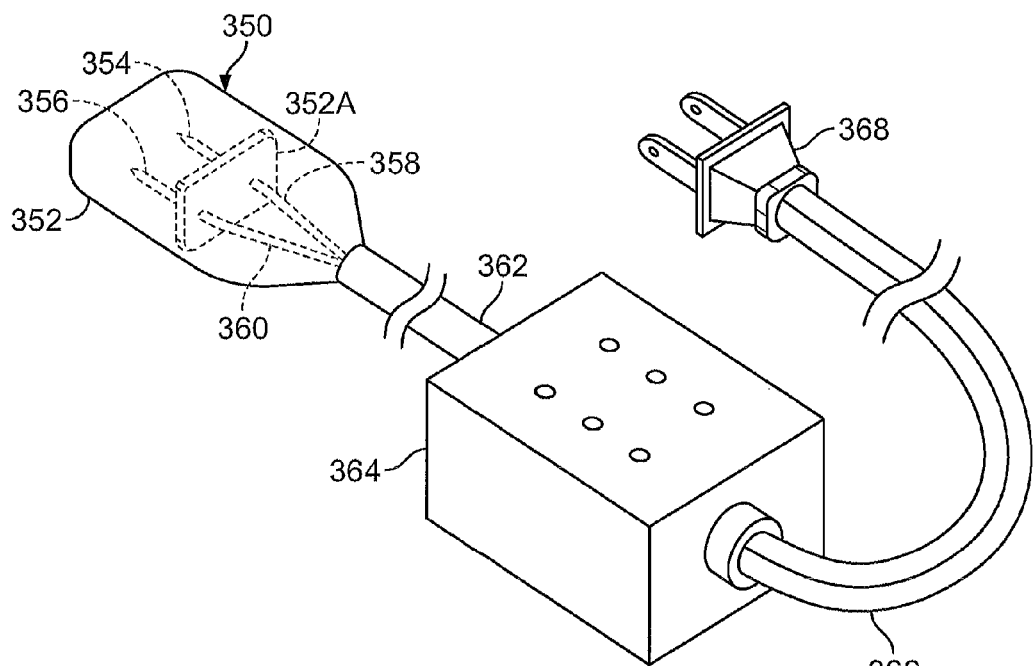
FIG. 12 is a perspective of the connector of Figure of 11 connected to a rectifier circuit.

Referring to FIG. 12, previously mentioned connector 350 is shown with its pointed pins 354 and 356 connecting through wall 352A to a pair of wires 358 and 360 that are routed through cable 362 to housing 364. Housing 364 contains the circuit shown in FIG. 2 and that circuit's output 12 connects to wires 358 and 360 of FIG. 12. The power input VAC of the circuit of FIG. 2 is represented in FIG. 12 as line 366 terminating in utility plug 368 designed to receive line voltage from an ordinary electrical outlet.

Figure 13:
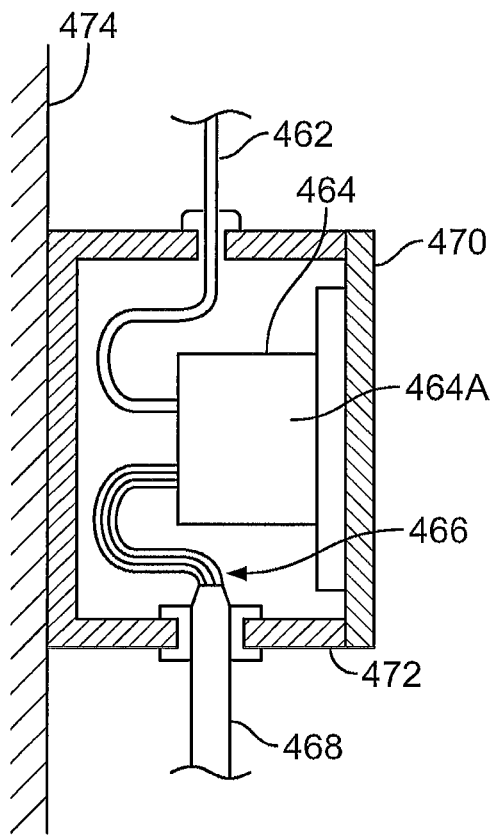
FIG. 13 is an elevational view, partly in cross-section, showing to a housing that contains a rectifier circuit that is an alternate to that of FIG. 12.

Referring to FIG. 13, housing 464 contains the circuit shown in FIG. 2, and that circuit's power input VAC is received through wire pair 466 of line 468, which is hardwired to one of the power lines in a building. The output of the circuit in housing 464 is routed through a wire pair in cable 462 to the previously illustrated connector (connector 350 of FIG. 12). The foregoing arrangement is intended for a more permanent installation or heavy-duty application. With this in mind, housing 464 is attached to cover 470 of a utility box 472 that is attached to structural component 474 (for example, a wall stud inside a wall). Such an installation may be useful for certain high-power applications. To accommodate a high power environment, housing 464, in this embodiment, is an aluminum casting with cooling fins 464A.

Figure 14:
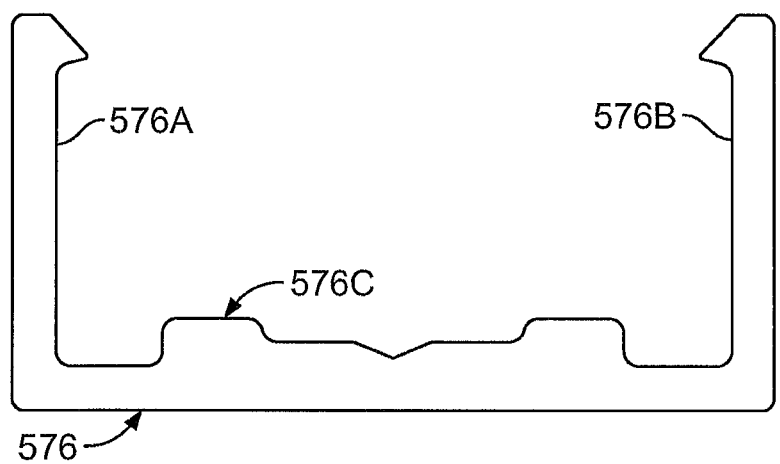
FIG. 14 is in end view of a clip used to hold the light strip of FIG. 7.

Referring to FIG. 14, clip 576 is a U-shaped channel designed to hold light strip 10 of FIG. 7. Clip 576 has a pair of opposing walls 576A and 576B that are barbed on top to capture the light strip 10. Floor 576C has ridges and grooves that provide an air passage under the light strip to allow heat dissipation. Clip 576 may be manufactured in a variety of lengths and can be cut to match the length of the specific light strip being installed.

To facilitate an understanding of the principles associated with the foregoing apparatus, its operation will be briefly described. A manufactured length of light strip 10 of FIG. 7 (or the light strip associated with the embodiment of FIG. 9) can be trimmed to a desired length by cutting through enclosure 40 at the position indicated by markings 48 (FIG. 10) or between abutting substrates 32. Severing in this manner will not end affect the integrity of any of the light circuits shown in FIG. 1. As shown in FIG. 4 the light circuits are arranged in separate banks, each bank containing four light circuits M1-M4. Because each of the light circuits M1-M4 are autonomous an installer can sever the light strip between any of the light circuits. Thus, an installer can cut between light circuits M1 and M2, between light circuits M2 and M3, or between light circuits M3 and M4. The installer can also cut a light strip between adjacent substrates, that is, cutting along dividing line 24 of FIG. 4 to separate substrate 14 from substrate 16.

In some cases, the overall length of the available light strip will be insufficient. In such a case a splicing connector (not shown) can be used that has a shell 352 as shown in FIG. 11, but will be open on opposite sides of wall 352A. In this case, wall 352A will still have the pins 354 and 356 projecting from one side of the wall, but will have on the opposite side another pair of pointed pins that align with pins 354 and 356. Thus the conductors 18 and 20 in one light strip will be spliced together with the corresponding conductors 18 and 20 in the other light strip.

The end of the light strip that is not destined to receive such a splicing device or the connector of FIG. 11 will be capped by a cup-shaped device (not shown). This capping device will have substantially the same shape as the distal portion of shell 352, will lack connector pins, and the outline of its mouth will be the mirror image of that shown in FIG. 11. Because this capping device, as well as connector 350, make intimate contact with the periphery of enclosure 40, there is little chance of humidity or dust reaching the inside of the enclosure to adversely affect the operation of the light strip. The quality of these seals can be enhanced by using an appropriate adhesive or caulk.

Light strip 10 can be installed by first securing the clip of FIG. 14 in place using adhesive, screws, nails, or other fastening devices. Connector 350 can be a pushed onto the end of light strip 10 as shown in FIG. 11, before or after snapping the light strip into clip 576. Power can be supplied to connector 350 by using either the arrangement of FIG. 12 or FIG. 13. A light switch (not shown) can be employed to turn light strip 10 on or off.

Conductors 18 and 20 supply power to each of the light circuits M1-M4 (FIG. 4) that are contained in the trimmed light strip. It will be noticed from FIG. 4 that substrate 14 (as well as substrate 16) need not carry current between individual light circuits M1-M4 and the greatest current flowing on a substrate is that needed to power an individual light circuit. Thus, while conductors 18 and 20 may be carrying relatively high current to supply a large number of light circuits, the amount of current tapped off through each of the leads J1-J8 is only that needed to supply power to an individual one of the light circuits M1-M4. Therefore, the current flowing on substrate 14 (or substrate 16 and its successors) is relatively small and no heat is generated to an extent that the operation of LEDs D1-D6 or transistor Q1 (FIG. 1) will be degraded.

As previously described in connection with FIG. 1, the current through LEDs D1-D6 will be limited by transistor Q1. When the half wave line voltage applied to terminal V1 reaches a voltage exceeding the sum of the forward conduction voltage drops of LEDs D1-D6, current will begin to flow. Current will begin to immediately flow at this stage since depletion mode, field effect transistor Q1 is arranged to immediately conduct when there is a small voltage at its drain D. As the voltage at terminal V1 continues to increase, eventually the voltage between gate G and source S of transistor Q1 becomes large enough to shut off the transistor thereby avoiding excessive current through LEDs D1-D6. The values of resistors R1 and R2 are selected to control this shutoff point. The foregoing process reduces the conduction angle, reduces heat, and allows tighter current control. In addition, the foregoing circuit can operate with a dimmer of the type that functions by reducing the conduction angle or by scaling down the amplitude of the AC voltage.

It is appreciated that various modifications may be implemented with respect to the above described embodiments. The illustrated light strips can be modified to have a different number of LEDs, which can be arranged in multiple rows or staggered in some other fashion. Also the various dimensions can be altered depending upon the desired light output, temperature stability, space available, etc. Instead of the above described extrusion, some embodiments may enclose a substrate by potting materials such as silicone, or the assembly may be made by overmolding, or by other processes.

Obviously, many modifications and variations of the present invention are possible in light of the above teachings. It is therefore to be understood that within the scope of the appended claims, the invention may be practiced otherwise than as specifically described.

What is claimed is:

1. A light strip comprising:
   a pair of conductors;
   a flexible enclosure extruded around said pair of conductors; and
   a lighting assembly comprising a plurality of flexible substrates positioned within said flexible enclosure, spaced apart from said pair of conductors and populated with a plurality of light circuits, said lighting assembly further comprising a plurality of connecting devices for electrically coupling said lighting assembly to said pair of conductors,
   wherein said plurality of flexible substrates are mounted in said flexible enclosure and each of said plurality of flexible substrates connects separately to said pair of conductors,
   wherein said plurality of connecting devices each comprises a separated pair of leads, each separated pair being electrically connected to a respective one of said plurality of flexible substrates, the separated pairs of leads including a plurality of first leads and a plurality of second leads, said plurality of first leads being directly connected to a plurality of spaced points on a first one of said pair of conductors, said plurality of second leads being directly connected to a plurality of spaced points on a second one of said pair of conductors.

2. A light strip according to claim 1 wherein each of said plurality of light circuits include a power restricting device.

3. A light strip according to claim 1 wherein said flexible enclosure is partially extruded around said separated pair of leads.

4. A light strip according to claim 3 wherein said flexible enclosure is extruded with a longitudinal split that is open to allow installation of said plurality of flexible substrates.

5. A light strip according to claim 1 wherein each of said plurality of flexible substrates has a given number of said plurality of light circuits, each of said given number of light circuits having a pair of solder pads separately connected to said pair of conductors.

6. A light strip according to claim 5 wherein said given number of light circuits (a) are arranged end to end, and (b) are adapted to be severed between any adjacent pair of said given number to operate autonomously.

7. A light strip according to claim 1 wherein said plurality of light circuits each comprise:
   a depletion mode field effect transistor;
   a serially connected plurality of light emitting diodes coupled to said transistor; and
   a power input coupled to said transistor and said plurality of light emitting diodes, said power input adapted to receive a time varying voltage varying over predetermined cycles, said transistor arranged to conduct over a limited conduction angle that ensures conduction at the start of a half cycle.

8. A light strip according to claim 7 further comprising:
   a resistive element;
   a pair of power input terminals adapted to connect to a power source and supply current to resistive element, said transistor, and said serially connected plurality of light emitting diodes, said transistor being serially connected between said resistive element and said serially connected plurality of light emitting diodes, said transistor having a gate connected to one of said pair of power input terminals.

9. A light strip according to claim 1 wherein said plurality of light circuits each comprise a plurality of light emitting diodes each having a forward voltage drop exceeding 8 volts.

10. A light strip according to claim 1 wherein each of said plurality of flexible substrates comprises:
    an insulating layer sandwiched between a pair of copper laminations that are etched into separate sections, said pair of copper laminations having a plurality of plated-through holes, a dedicated portion of which are arranged to conduct heat without conducting electrical current.

11. A light strip according to claim 10 wherein a marked portion of said plurality of plated-through holes are arranged to receive a non-functional component that signifies a quality of a corresponding one of said plurality of flexible substrates.

12. A light strip comprising:
    a pair of conductors;
    a flexible enclosure extruded around said pair of conductors; and
    a lighting assembly comprising a flexible substrate positioned within said flexible enclosure, spaced apart from said pair of conductors and populated with a plurality of light circuits, said lighting assembly further comprising a plurality of connecting devices for electrically coupling said lighting assembly to said pair of conductors,
    wherein said flexible substrate is mounted in said flexible enclosure and each of said plurality of light circuits connects separately to said pair of conductors, wherein said plurality of connecting devices each comprises a separated pair of leads, each separated pair being electrically connected to the flexible substrate, the separated pairs of leads including a plurality of first leads and a plurality of second leads, said plurality of first leads being directly connected to a plurality of spaced points on a first one of said pair of conductors, said plurality of second leads being directly connected to a plurality of spaced points on a second one of said pair of conductors.

13. A light strip according to claim 12 wherein each of said plurality of light circuits include a power restricting device.

14. A light strip according to claim 12 wherein said flexible enclosure is partially extruded around said separated pair of leads.

15. A light strip according to claim 12 wherein said flexible enclosure is extruded with a longitudinal split that is open to allow installation of said flexible substrate.

16. A light strip according to claim 12 wherein said flexible substrate has a given number of said plurality of light circuits, each of said given number of light circuits having a pair of solder pads separately connected to said pair of conductors.

17. A light strip according to claim 16 wherein said given number of light circuits (a) are arranged end to end, and (b) are adapted to be severed between any adjacent pair of said given number to operate autonomously.

18. A light strip according to claim 12 wherein said plurality of light circuits each comprise:
a depletion mode field effect transistor;
a serially connected plurality of light emitting diodes coupled to said transistor; and
a power input coupled to said transistor and said plurality of light emitting diodes, said power input adapted to receive a time varying voltage varying over predetermined cycles, said transistor arranged to conduct over a limited conduction angle that ensures conduction at the start of a half cycle.

19. A light strip according to claim 18 comprising:
a resistive element;
a pair of power input terminals adapted to connect to a power source and supply current to resistive element, said transistor, and said serially connected plurality of light emitting diodes, said transistor being serially connected between said resistive element and said serially connected plurality of light emitting diodes, said transistor having a gate connected to one of said pair of power input terminals.

20. A light strip according to claim 12 wherein said plurality of light circuits each comprise:
a plurality of light emitting diodes each having a forward voltage drop exceeding 8 volts.

21. A light strip according to claim 12 wherein said flexible substrate comprises:
an insulating layer sandwiched between a pair of copper laminations that are etched into separate sections, said pair of copper laminations having a plurality of plated-through holes, a dedicated portion of which are arranged to conduct heat without conducting electrical current.

22. A light strip according to claim 21 wherein a marked portion of said plurality of plated-through holes are arranged to receive a non-functional component that signifies a quality of said flexible substrate.

* * * * *